United States Patent [19]
Wu

[11] Patent Number: 6,114,201
[45] Date of Patent: Sep. 5, 2000

[54] METHOD OF MANUFACTURING A MULTIPLE FIN-SHAPED CAPACITOR FOR HIGH DENSITY DRAMS

[75] Inventor: Shye-Lin Wu, Hsinchu, Taiwan

[73] Assignee: Texas Instruments–Acer Incorporated, Hsinchu, Taiwan

[21] Appl. No.: 09/088,458

[22] Filed: Jun. 1, 1998

[51] Int. Cl.[7] .................................................. H01L 21/20

[52] U.S. Cl. ........................................ 438/254; 438/397

[58] Field of Search ................................... 438/254, 396, 438/397; 257/303, 304, 306

[56] References Cited

U.S. PATENT DOCUMENTS

| | | | |
|---|---|---|---|
| 5,170,233 | 12/1992 | Liu et al. | 438/397 |
| 5,532,182 | 7/1996 | Woo | 438/254 |
| 5,650,351 | 7/1997 | Wu | 438/396 |
| 5,656,536 | 8/1997 | Wu | 438/397 |
| 5,677,222 | 10/1997 | Tseng | 438/254 |
| 5,770,499 | 6/1998 | Kwok et al. | 438/253 |
| 5,789,267 | 8/1998 | Hsia et al. | 438/396 |
| 5,817,553 | 10/1998 | Stengl et al. | 438/253 |
| 5,834,357 | 11/1998 | Kang | 438/396 |
| 5,843,822 | 12/1998 | Hsia et al. | 438/254 |
| 5,851,876 | 12/1998 | Jeng | 438/253 |
| 5,879,987 | 3/1999 | Wang | 438/253 |
| 5,891,772 | 4/1999 | Hsu | 438/254 |
| 5,907,782 | 5/1999 | Wu | 438/253 |
| 5,909,621 | 6/1999 | Hsia et al. | 438/254 |
| 5,998,260 | 12/1999 | Lin | 438/254 |

OTHER PUBLICATIONS

Wolf, Silicon Processing for the VLSI Era, Lattice Press, vol. 2, p. 223, 1990.

H. Watanabe et al., A New Cylindrical Capacitor Using Hemispherical Grained Si (HSG–Si) for 256Mb DRAMs 1992 IEEE, pp. 259–262.

*Primary Examiner*—Olik Chaudhuri
*Assistant Examiner*—Anh Duy Mai
*Attorney, Agent, or Firm*—Harness, Dickey & Pierce, P.L.C.

[57] ABSTRACT

The present invention is a method of manufacturing a high density capacitors for use in semiconductor memories. High etching selectivity between BPSG (borophososilicate glass) and CVD-oxide (chemical vapor deposition oxide) is used to fabricate a multiple fin-shape capacitor with a plurality of horizontal fins and vertical pillars. First, a contact hole formed on a semiconductor substrate using an etching process. A first polysilicon layer is then deposited in the contact hole to form a plug. A composition layer consists of BPSG and silicon oxide formed on the substrate. Then a opening is formed in the composition layer to serve as a storage node. A highly selective etching is then used to etch the BPSG sublayers of the composition layer. Next, a second polysilicon layer is formed along the surface of the composition layer, the substrate and the plug. Then a SOG layer is formed along the surface of the second polysilicon layer. A CMP process is used to polish a portion of the SOG layer and a portion of the second polysilicon layer on the top of the composition layer. The SOG layer and the composition layer are subsequently removed by BOE solution. A dielectric film is then formed on the second polysilicon layer and the substrate. Finally, a third polysilicon layer is formed along the surface of the dielectric layer. Thus, a capacitor with a plurality of horizontal fins and vertical pillars is formed.

20 Claims, 7 Drawing Sheets

METHOD OF MANUFACTURING A MULTIPLE FIN-SHAPED CAPACITOR FOR HIGH DENSITY DRAMS

FIELD OF THE INVENTION

The present invention relates to semiconductor capacitors, and more specifically, to a method for forming a multiple fin-shaped structure capacitor.

BACKGROUND OF THE INVENTION

Semiconductor Dynamic Random Access Memory (DRAM) devices have been applied in integrated circuits for many years. A memory cell typically consists of a storage capacitor and an access transistor for each bit to be stored by the semiconductor DRAM. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits.

With the development of Ultra Large Scale Integrated (ULSI)DRAM devices, the sizes of memory cells have gotten smaller and smaller such that the area available for a single memory cell has become very small. This has caused a reduction in capacitor area, which in turn results in a reduction in cell capacitance. The reduction in memory cell area is required for high density DRAMs. This causes reduction in capacitor area, resulting in the reduction of cell capacitance. For very small memory cells, planar capacitors become very difficult to use reliably. Specifically, as the size of the capacitor decreases, the capacitance of the capacitor also decreases. Similarly, the amount of the charge capable of being stored by the capacitor decreases. This results in the capacitor being very susceptible to a particle radiation. Additionally, as the capacitance decreases, the charge held by storage capacitor must be refreshed often. A simple stacked capacitor cannot provide sufficient capacitance, even with high dielectric films, such as $Ta_2O_5$, for the DRAM capacitor.

Prior art approaches to overcome these problems have resulted in the development of the various types of capacitors. Such as the trench capacitor (see for example U.S. Pat. No. 5,374,580) and the stacked capacitor (see for example U.S. Pat. No. 5,021,357). However, the trench capacitor suffers from the well-known problem of "gated diode leakage," which is the leakage of current resulting in the trench capacitor failing to hold a charge. The manufacture of the stacked capacitor causes difficulties due to the limitation of the lithography technique. In addition, reducing the thickness of the dielectric also can improve the capacitance of the capacitor, but this approach is limited because of yield and reliability problems.

A capacitor-over-bit-line (COB) cell with a hemispherical-grain (HSG) polysilicon storage node has been developed (please see "A CAPACITOR-OVER-BIT-LINE CELL WITH HEMISPHERICAL-GRAIN STORAGE NODE FOR 64Mb DRAMs", M. Sakao et al., microelectronics research laboratories, NEC Corporation). The HSG-Si is deposited by a low pressure chemical vapor deposition method at the transition temperature from amorphous-Si to polycrystalline-Si. Further, a cylindrical capacitor using HemisphericalGrained Si has been proposed (see "A NEW CYLIDRICAL CAPACITOR USING HEMISPHERICAL GRAINED Si FOR 256 Mb DRAMs", H. Watanabe et al., Tech Dig,Dec. 1992, pp. 259–262). By using the etching selectivity, some novel capacitors, such as the crown shaped capacitor with fins, are proposed. (Please see U.S. Pat. No. 5,164,337.)

SUMMARY OF THE INVENTION

A dielectric layer for isolation is formed over a substrate. A nitride layer is subsequently formed on the dielectric layer. Then, a contact hole is formed by well-known technology. A first conductive layer is subsequently deposited on the nitride layer. An etching process is used to etch back a portion of the first conductive layer for forming a plug. A composition layer consisting of alternating BPSG layers and silicon dioxide layers is formed on the nitride layer and the plug. The composition layer is formed on the nitride layer and the plug repeatedly by deposition.

Next, a photoresist is patterned on the composition layer to define the storage node. An etching is then used to etch the composition layer. After the photoresist is removed, a highly selective etching process is then used to removed a portion of the BPSG layers. In preferred embodiment, the selective etching step utilizes a low pressure HF vapor to selectively etch the BPSG layers and silicon dioxide layers. The relative susceptibility to etching of the BPSG layers to the silicon dioxide layers is about 2000 to 1. A second conductive layer is then conformally deposited along the surface of the composition layer, the nitride layer and the plug. Next, a SOG layer is formed along the surface of the second conductive layer. An CMP process is used to remove a portion of the SOG layer and a portion of the second conductive layer on the top surface of the composition layer.

Then the BPSG layers, the silicon dioxide layers and the SOG layer are removed to form a multiple fin shape with a plurality of horizontal fins and vertical pillars. The next step of the formation is to deposit a dielectric film along the surface of the second conductive layers. A third conductive layer is subsequently formed along the surface of the dielectric layer to form the top storage node.

BRIEF DESCRIPTION OF THE DRAWINGS

The foregoing aspects and many of the attendant advantage of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a high density memory cell for DRAM, which has an enlarged surface area of the capacitor to increase the performance of the memory cell. Further, the present invention uses high etching selectivity (higher than 2000:1) between BPSG (borophosphosilicate glass) and CVD silicon dioxide to form multi-fin capacitor structure. As will be seen below, this technique can be used to create a multiple fin-shape capacitor with a plurality of horizontal fins and vertical pillars. The detailed processes will be described as follows.

Figure 1:
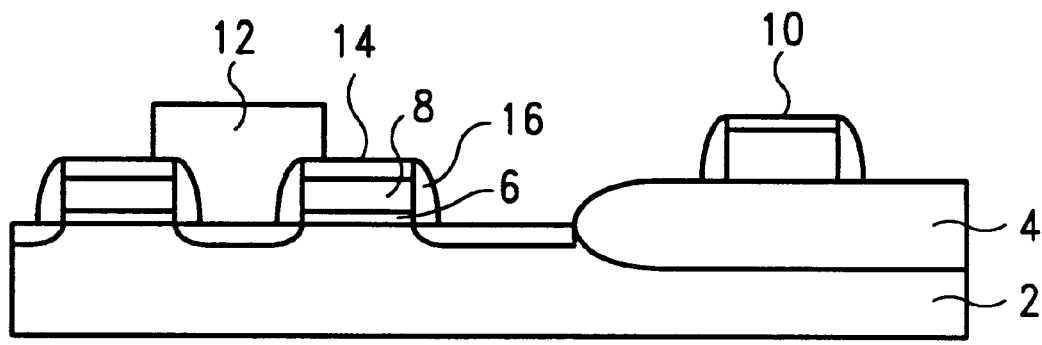
FIG. 1 is a cross-sectional view of a semiconductor wafer illustrating the step of forming a transistor, word line and bit line on a semiconductor substrate.

Referring to FIG. 1, a single crystal P-type substrate 2 with a <100> crystallographic orientation is used for the preferred embodiment. A thick field oxide region 4, FOX 4, is created for the purposes of isolation. Generally speaking, the FOX 4 region is created via photolithography and dry etching steps to etch a silicon nitride silicon dioxide composite layer. After the photoresist is removed and wet cleaned, a thermal oxidation in an oxygen-steam ambient is used to form the FOX 4 region, to a thickness of about 3000–8000 angstroms.

Initially, a silicon dioxide layer 6 is created atop the substrate 2 to use as a gate oxide. In the preferred embodiment, the silicon dioxide layer 6 is formed by using an oxygen-steam ambient, at a temperature between about 750 to 1100° C. Alternatively, the gate oxide 6 may be formed using other known oxide chemical compositions and procedures. As is known in the art, the silicon dioxide layer 6 can be formed by using chemical vapor deposition (CVD) process, using TEOS as a source at a temperature between about 600 to 800° C., at a pressure 0.1 to 10 torrs. In the preferred embodiment, the thickness of the silicon dioxide layer 6 is approximately 30–200 angstroms.

Still referring to FIG. 1, after the first silicon dioxide layer 6 is formed, a first polysilicon layer 8 is formed over the silicon dioxide layer 6 and the field oxide regions 4. In the preferred embodiment, the first polysilicon layer 8 is formed by using conventional chemical vapor deposition (CVD) to have a thickness of about 1000–5000 angstroms. Then, a word line 10, a bit line 12, gate structures with cap layer 14, and side wall spacers 16, are formed by well-known technology and is not particularly germane to the present invention. Thus, only a cursory description of the formation of gate structure is given here.

Figure 2:
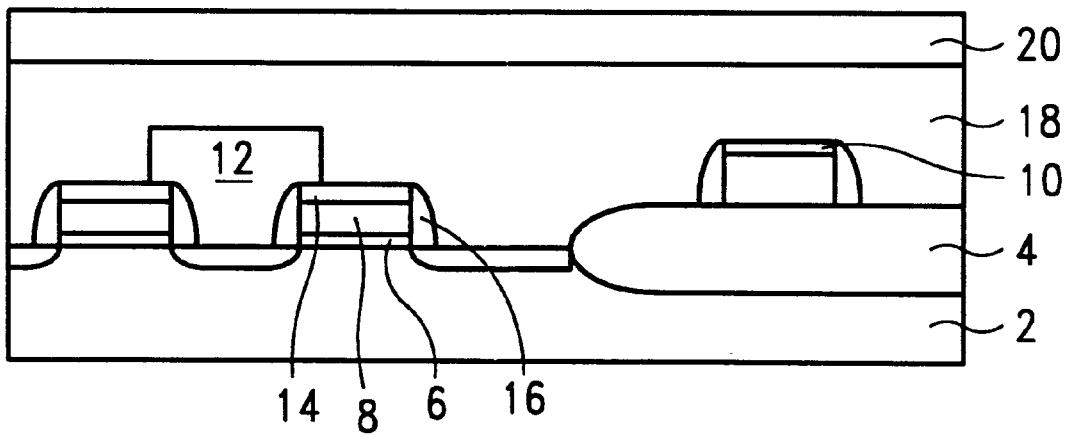
FIG. 2 is a cross-sectional view of a semiconductor wafer illustrating the step of forming a dielectric layer and a nitride layer on the semiconductor substrate.
Figure 3:
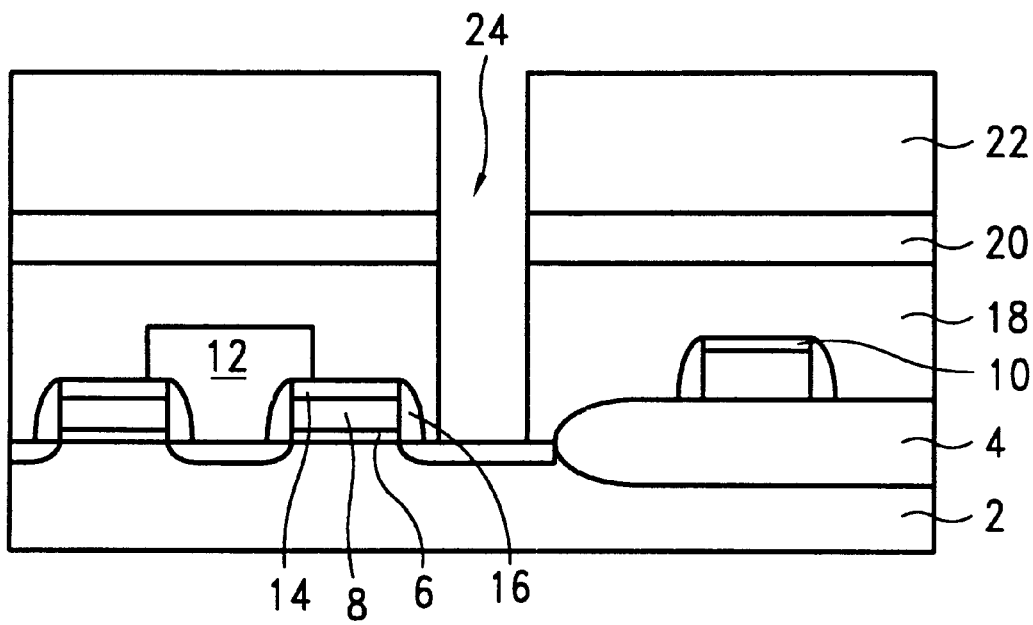
FIG. 3 is a cross-sectional view of a semiconductor wafer illustrating the step of forming a contact hole in the nitride layer and in the dielectric layer.

As shown in FIG. 2, a dielectric layer 18 for isolation is formed on the gate structures, FOX 4 and substrate 2 to a thickness of about 3000–10000 angstroms. The dielectric layer 18 is preferably formed of silicon oxide. A nitride layer 20 is subsequently formed on the dielectric layer 18. The nitride layer 20 is used as an etching barrier to prevent the dielectric layer 18 from etching for later process. The nitride layer 20 has a thickness at a range about 300–2000 angstroms. Then, referring to FIG. 3, a first photoresist 22 is pattern on the nitride layer 20 to expose a region where will be generated a contact hole for subsequent process. An etching is used to etch the dielectric layer 18 and the nitride layer 20 to form a contact hole 24. In one embodiment, a plasma etching is performed to create the contact hole 24 for storage node contact. The etchant to remove oxide is selected from the group of $CCl_2F_2$, $CHF_3/CF_4$, $CHF_3/O_2$, $CH_3CHF_2$, $CF_4/O_2$, while the nitride layer is removed by using $CF_4/H_2$, $CHF_3$ or $CH_3CHF_2$. Then the first photoresist is removed away.

Figure 4:
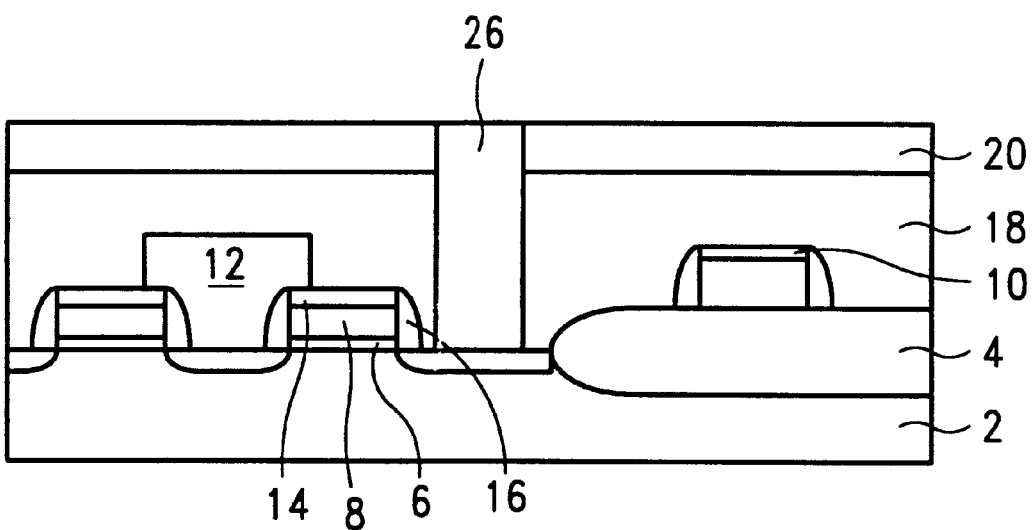
FIG. 4 is a cross-sectional view of a semiconductor wafer illustrating the step of forming a polysilicon plug in the contact hole.

Turning next to FIG. 4, a first conductive (not shown) layer is subsequently deposited on the nitride layer 20 and refilled the contact hole 24. Preferably, the first conductive layer can be formed using doped polysilicon, in-situ doped polysilicon or metal such as aluminum, copper, tungsten, titanium, silicide, PtSi, WSi, $TiSi_2$ or $CoSi_2$. An etching is then used to etch the first conductive layer back until the nitride layer 20 is reached to form a plug 26 in the contact hole 24. The etchant to etch polysilicon is $SiCl_4/Cl_2$, $BCl_3/Cl_2$, $HBr/Cl_2/O_2$, $HBr/O_2$, $Br_2/SF_6$ or $SF_6$.

Figure 5:
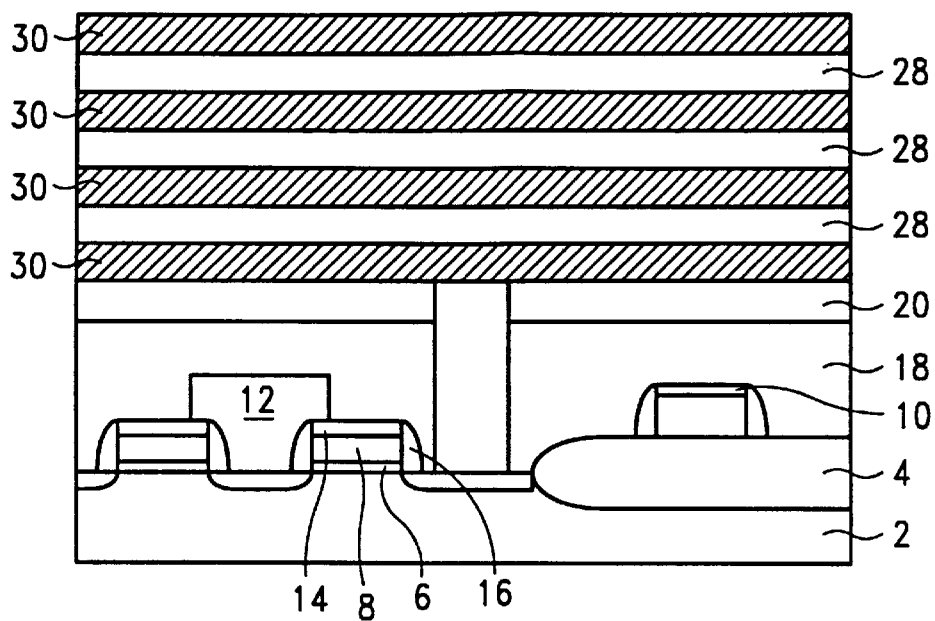
FIG. 5 is a cross-sectional view of a semiconductor wafer illustrating the step of forming a composition layer consisting of alternating BPSG (borophosphosilicate glass) layers and silicon oxide layers on the nitride layer and the polysilicon plug.

Turning next to FIG. 5, a composition layer consisting of alternating BPSG layers 28 and silicon dioxide layers 30 is formed on the nitride layer 20 and the top of the plug 26. The composition layer is formed on the nitride layer 20 and the plug 26 repeatedly by deposition. The composition layers are composed of odd layers and even layers. The odd layers may be silicon dioxide layers and the even layers may be BPSG, or alternatively, the odd layers may be BPSG and the even layers may be silicon dioxide layers. The BPSG layers 28 can be formed by low pressure chemical vapor deposition using tetraethylorthosilicate (TEOS) as a reactant. Boron and phosphorus are added during the formation of the borophosphosilicate glass layer. The thickness of the BPSG layers 28 is 300 to 1000 angstroms. The silicon dioxide layers 30 can be formed by any suitable process such as chemical vapor deposition process, using TEOS as a source at a temperature between about 600 to 800° C., at a pressure of 1 to 10 torrs, and to a thickness about 300 to 1000 angstroms.

Figure 6:
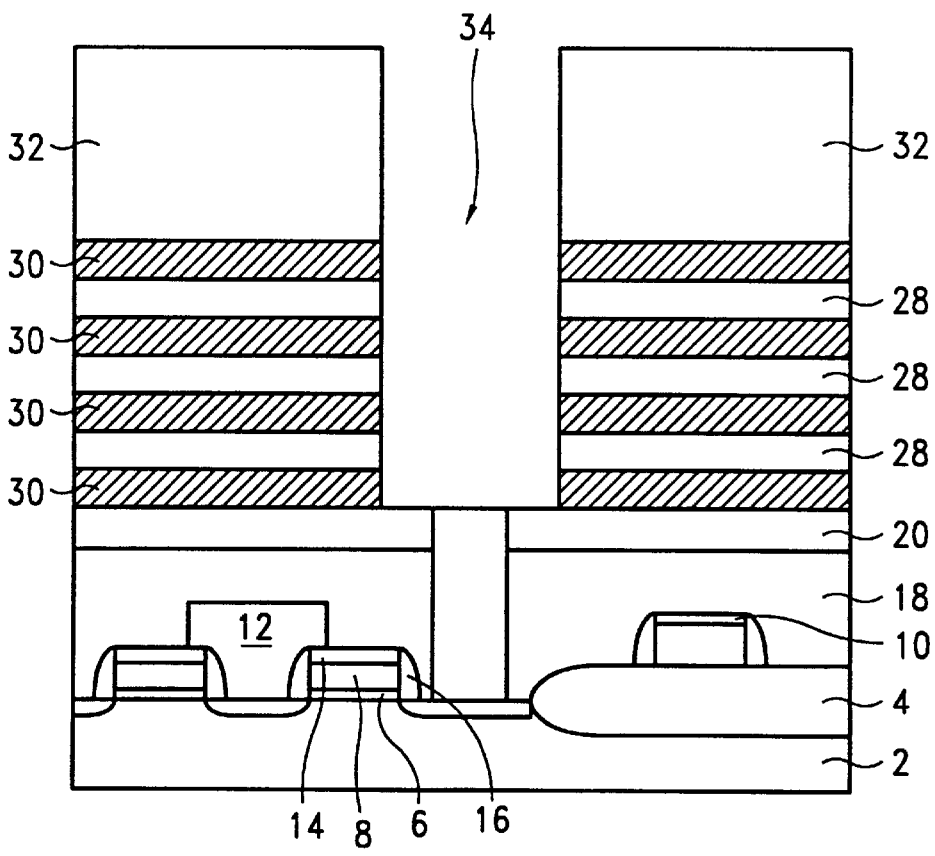
FIG. 6 is a cross-sectional view of a semiconductor wafer illustrating the step of forming an opening in the composition layer to form the storage node later.

Turning next to FIG. 6, a second photoresist 32 is patterned on the composition layer to expose a region where will be generated a storage node for a subsequent process. Then an etching is used to etch the composition layer for forming an opening 34 in the composition layer. In this embodiment, a plasma etching is performed to create the opening 34 for forming the storage node. The etchant to remove oxide is selected from the group of $CCl_2F_2$, $CHF_3/CF_4$, $CHF_3/O_2$, $CH_3CHF_2$, $CF_4/O_2$. The second photoresist 32 is then stripped.

Figure 7:
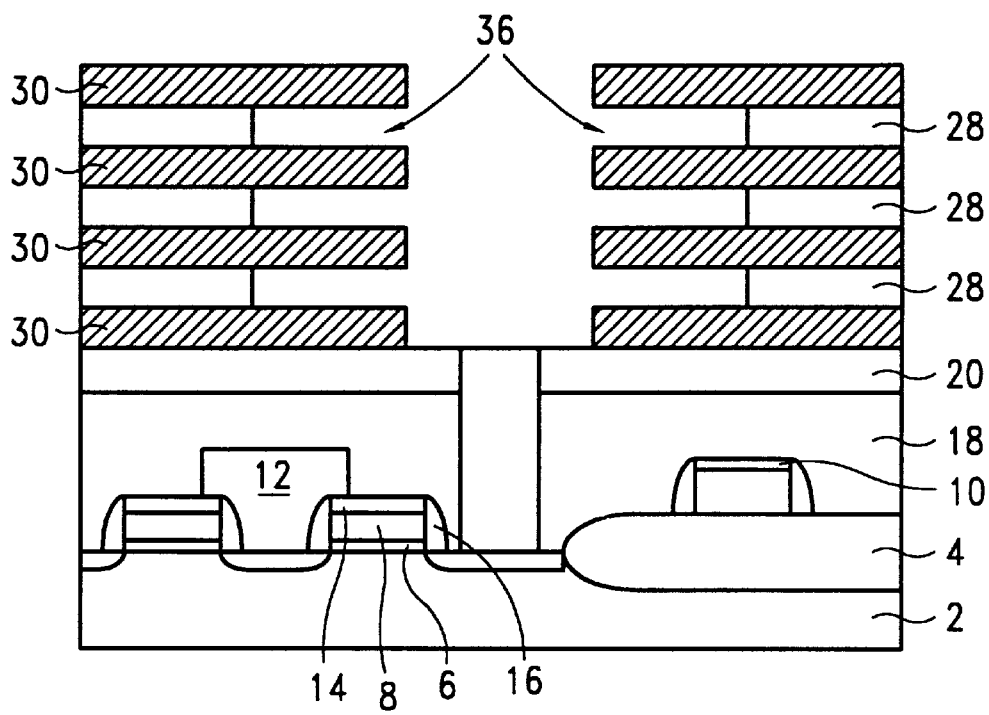
FIG. 7 is a cross-sectional view of a semiconductor wafer illustrating the step of selectively etching the BPSG layers of the composition layer.

Next, referring to FIG. 7, a highly selective etching process is used to removed a portion of the BPSG layers 28 to form lateral cavities 36. An important key of the present invention is that the etching rate of BPSG to etching is much greater than that of silicon dioxide. In a preferred embodiment, the selective etching step utilizes a low pressure HF vapor to selectively etch the BPSG layers 28 and silicon dioxide layers 30. The relative susceptibility to etching of the BPSG layers 28 to the silicon dioxide layers 30 is about 2000 to 1. In addition, the susceptibility of BPSG to etching is also much greater than that of BSG, thus the BSG layer can be used to replace the silicon dioxide layer. Therefore, the BPSG layers 28 is etched away much more significantly than the silicon dioxide layers 30.

Figure 8:
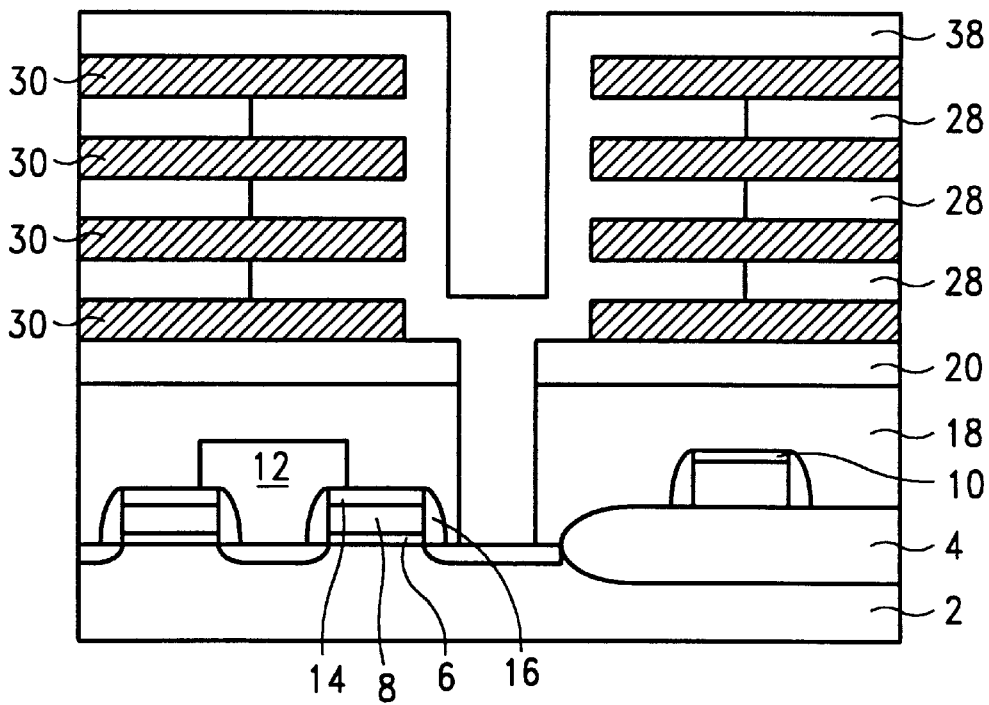
FIG. 8 is a cross-sectional view of a semiconductor wafer illustrating the step of forming a second conductive layer on the composition layer.

Referring to FIG. 8, a second conductive layer 38 is deposited using a LPCVD (low pressure chemical vapor deposition) process along the surface of the composition layer, on the nitride layer 20 and the plug 26 exposed by the composition layer. In addition, the second conductive layer 38 is also conformally refilled in cavities 36 between the BPSG layers 28 and the silicon dioxide layers 30. In this embodiment, the second conductive layer 38 has a thickness of between 300 to 3000 angstroms. The second conductive layer 38 can be chosen from doped polysilicon, in-situ doped polysilicon, aluminum, copper, tungsten, or titanium.

Figure 9:
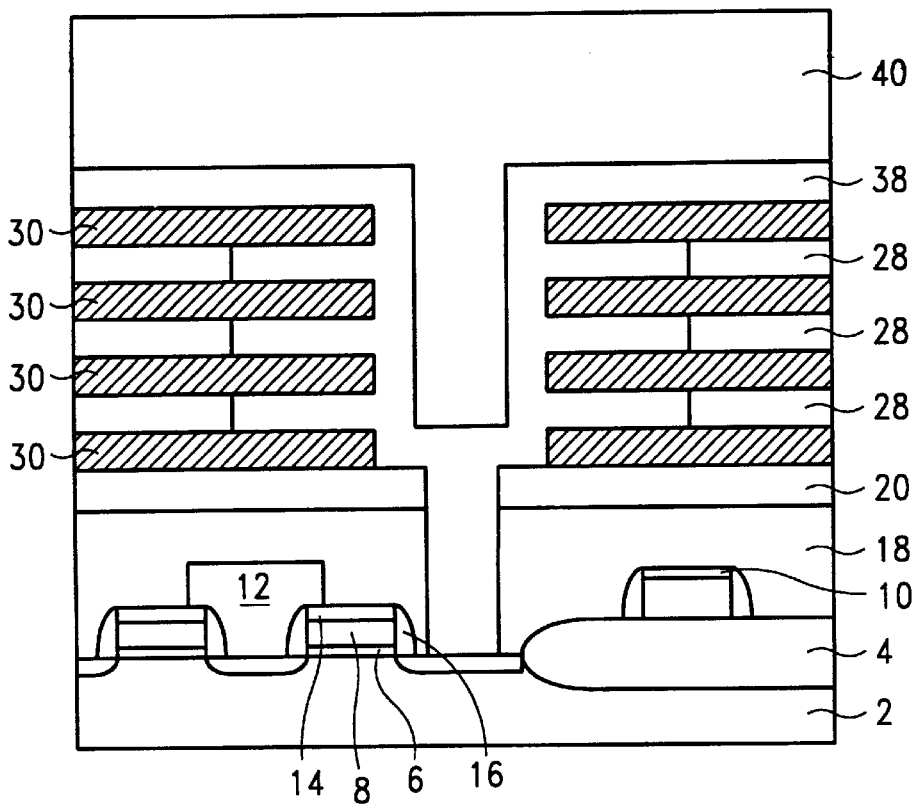
FIG. 9 is a cross-sectional view of a semiconductor wafer illustrating the step of forming a thick SOG layer along the surface of the second conductive layer.
Figure 10:
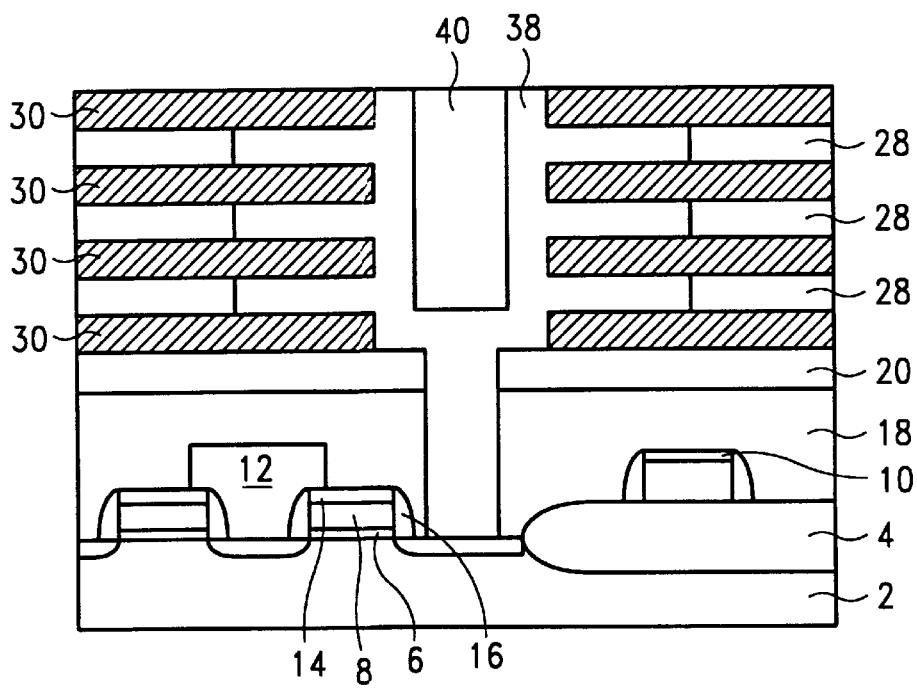
FIG. 10 is a cross-sectional view of a semiconductor wafer illustrating the step of removing the SOG layer and the second conductive layer on the top surface of the composition layer.

Next, referring to FIG. 9, a thick SOG (spin-on glass) layer 40 is coated along the surface of the second conductive layer 38 to serve as a sacrificial layer. Alternatively, the SOG layer 40 can be replaced by a photoresist. Then, A portion of the SOG layer 40 and a portion of the second conductive layer 38 on the top surface of the composition layer are removed by using a CMP (chemical mechanism polishing) process, as shown in FIG. 10.

Figure 11:
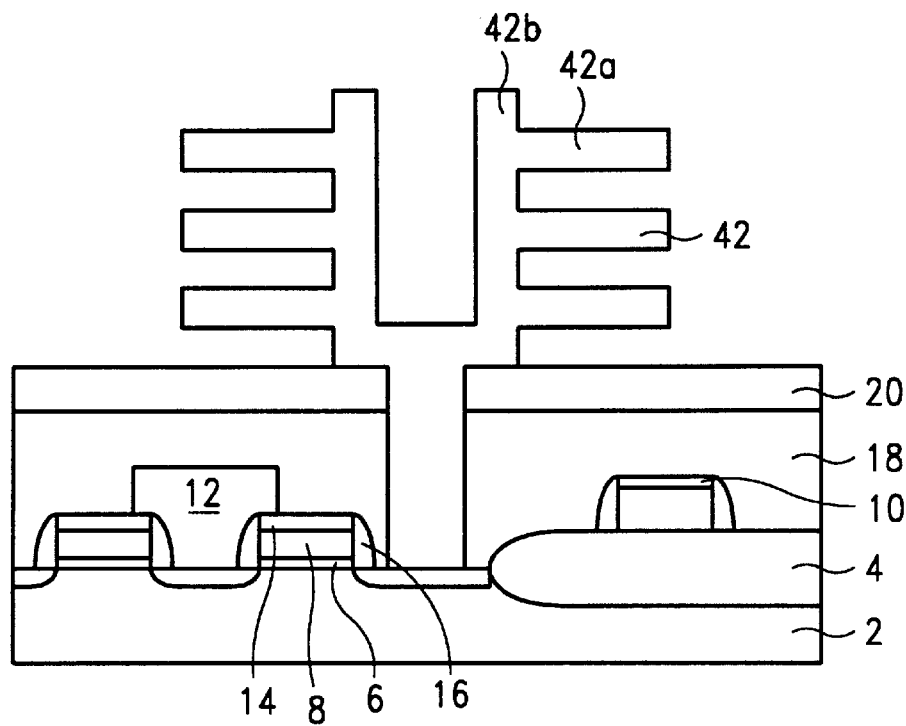
FIG. 11 is a cross-sectional view of a semiconductor wafer illustrating the step of removing the BPSG and silicon oxide composition layers and the SOG layer.

Turning next to FIG. 11, the BPSG layers 28, the silicon dioxide layers 30 and the SOG layer 40 residual on the second conductive layer 38 are removed by using a BOE (buffer oxide etching) solution to form a multiple fin-shape 42 with a plurality of horizontal fins 42a and vertical pillars 42b. The resulting structure is used as the bottom storage electrode of the capacitor to increase the area of the capacitor effectively.

Figure 12:
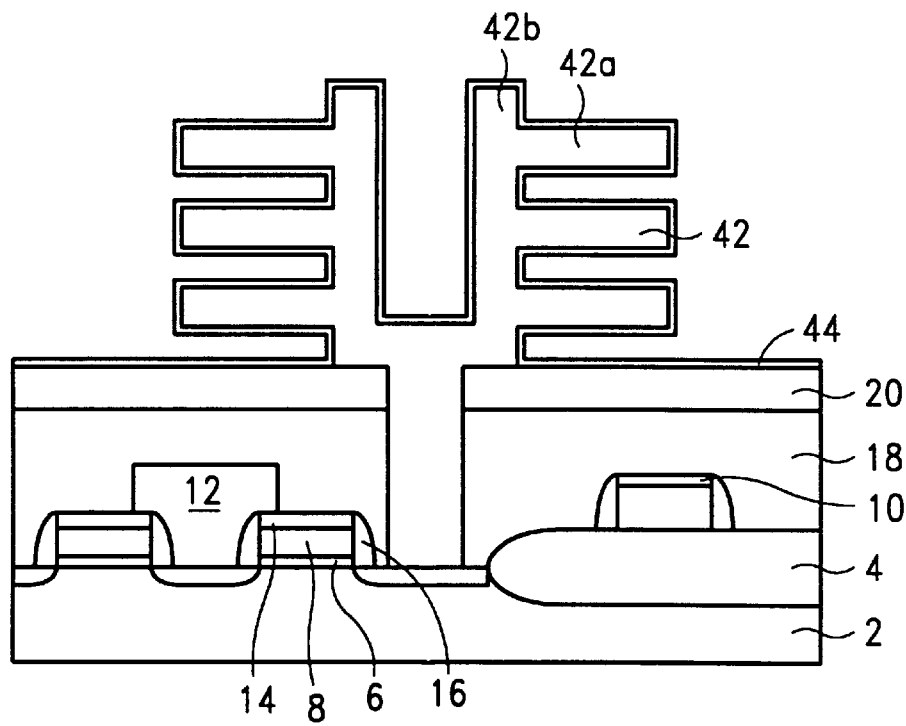
FIG. 12 is a cross-sectional view of a semiconductor wafer illustrating the step of forming a thin dielectric layer along the surface of the second conductive layer and the nitride layer.
Figure 13:
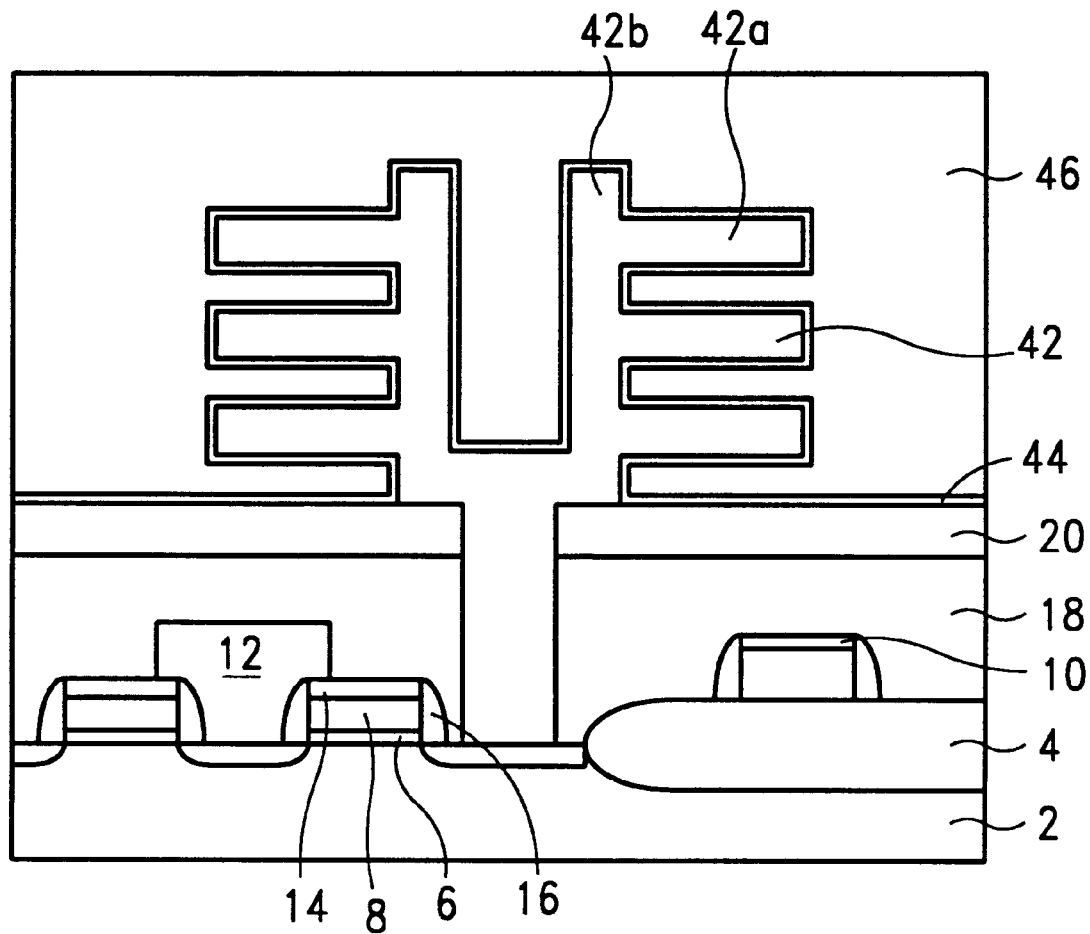
FIG. 13 is a cross-sectional view of a semiconductor wafer illustrating the step of forming a third conductive layer along the surface of the dielectric layer.

Turning to FIG. 12, the next step is the deposition of a thin dielectric film 44 along the surface of the second conductive layers 38 and the nitride layer 20. Typically, the dielectric film 44 is preferably formed of either a double film of nitride/oxide film, a triple film of oxide/nitride/oxide, or any other high dielectric film such as tantalum oxide($Ta_2O_5$), BST, PZT, PLZT, etc. Finally, referring to FIG. 13, a third conductive layer 46 is deposited over the dielectric film 44. The third conductive layer 46 is used as the cell plate and is formed of doped polysilicon, in-situ doped polysilicon, aluminum, copper, tungsten or titanium.

The present invention can provide various benefits over the prior art. First, the multiple fin-shaped capacitor structure is fabricated in only one-step conductive layer deposition and this can effectively avoid the fin crack. Second, a multiple fin-shape structure can significantly increase the surface area of the capacitor. Therefore the present invention increases the performance of the capacitor.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing an integrated circuit capacitor, the method comprising the steps of:
   forming a dielectric layer on a semiconductor substrate;
   forming a nitride layer on said dielectric layer;
   etching said nitride layer and said dielectric layer to form a contact hole for exposing a portion of said semiconductor substrate;
   forming a first conductive layer on said semiconductor substrate, in said contact hole;
   removing a portion of said first conductive layer to form a plug and expose an upper surface of said nitride layer
   forming a composition layer with a plurality of sublayers on said nitride layer and the top of said plug, said composition layer including a plurality of sublayers, at least two of said sublayers having a susceptibility to etching that differs;
   etching said composition layer to form an opening for exposing said top of said plug; and a portion of said nitride layer
   selectively etching said composition layer;
   forming a second conductive layer along a surface of said composition layer on, said nitride layer, and self-aligned onto said plug;
   forming a sacrificial layer along a surface of said second conductive layer;
   removing a portion of said sacrificial layer and a portion of said second conductive layer on a top surface of said composition layer by using the chemical mechanical polishing procedure to make said residual second conductive layer have two protruding portions extending upwardly;
   removing said composition layer, said sacrificial layer;
   forming a capacitor dielectric layer along the surface of said second conductive layer, said nitride layer; and
   forming a third conductive layer over said capacitor dielectric layer.

2. The method of claim 1, further comprises following steps before forming said first conductive layer:
   forming a dielectric layer on said substrate; and
   forming a nitride layer on said dielectric layer.

3. The method of claim 2, wherein said dielectric layer has a thickness about 3000–10000 angstroms.

4. The method of claim 1, wherein said sublayers comprise of BPSG layers and silicon dioxide layers.

5. The method of claim 1, wherein said sublayers comprise of BPSG layers and BSG layers.

6. The method of claim 4, wherein said BPSG sublayers have a thickness of a range between 300–1000 angstroms, said silicon dioxide sublayers have a thickness of a range between 300–1000 angstroms.

7. The method of claim 5, wherein said BPSG sublayers have a thickness of a range between 300–1000 angstroms, said BSG sublayers have a thickness of a range between 300–1000 angstroms.

8. The method of claim 1, wherein said second conductive layer has a thickness of a range between 300–1000 angstroms.

9. The method of claim 1, wherein said sacrificial layer comprise of SOG.

10. The method of claim 1, wherein said sacrificial layer comprise of photoresist.

11. The method of claim 1, wherein the step of etching the composition layer is done with a low pressure HF vapor.

12. The method of claim 9, wherein the step of removing said composition layer and said SOG layer is done using a BOE (buffer oxide etching) solution.

13. The method of claim 1, wherein said capacitor dielectric layer is selected from a group of N/O, O/N/O, $Ta_2O_5$, BST, PZT and PLZT.

14. The method of claim 1, wherein said first conductive layer, said second conductive layer and said third conductive layer are selected from the group of doped polysilicon, in-situ doped polysilicon, aluminum, copper, tungsten, and titanium combinations thereof.

15. A method for manufacturing an integrated circuit capacitor, the method comprising the steps of:

forming an oxide layer on a semiconductor substrate;

forming a nitride layer on said dielectric layer;

etching said nitride layer and said oxide layer to form a contact hole for exposing a portion of said semiconductor substrate;

forming a first conductive layer on said nitride layer, in said contact hole;

removing a portion of said first conductive layer above said nitride layer to form a plug in said contact hole;

forming a composition layer that consists of alternating sublayers of BPSG sublayers and silicon dioxide sublayers on said nitride layer and the said plug;

etching said composition layer to form an opening for exposing said top of said plug; and a portion of said nitride layer selectively etching said composition layer;

forming a second conductive layer on a surface of said composition layer on, said nitride layer, and self-aligned onto said plug;

forming a sacrificial layer along a surface of said second conductive layer;

chemical mechanical polishing said said sacrificial layer and said second conductive layer until a top surface of said composition layer is exposed, wherein said residual second conductive layer has two protruding portions extending upwardly thereon;

removing said composition layer, said sacrificial layer;

forming a capacitor dielectric layer along the surface of said second conductive layer, said nitride layer; and forming a third conductive layer over said capacitor dielectric layer.

16. The method of claim 15, wherein the step of etching the composition layer is done with a low pressure HF vapor.

17. The method of claim 15, wherein the step of removing said composition layer and said sacrificial layer is done using a BOE (buffer oxide etching) solution.

18. A method of forming a multiple fin-shape polysilicon with a plurality of fins and pillars comprising the steps of:

forming an oxide layer on a semiconductor substrate;

forming a nitride layer on said oxide layer;

patterning a first photoresist on said nitride layer to define a contact hole;

etching said nitride layer and said oxide layer using said first photoresist as an etching mask to form said contact hole on said semiconductor substrate;

removing said first photoresist;

forming a first doped polysilicon layer on said nitride layer, in said contact hole;

etching a portion of said first doped polysilicon layer to form a plug;

forming a composition layer that consists of alternating sublayers of BPSG sublayers and silicon dioxide sublayers on said nitride layer and a top of said plug;

patterning a second photoresist on said composition layer to define a storage node;

etching said composition layer to a surface of said nitride layer and said plug using said second photoresist as an etching mask;

removing said second photoresist;

etching said BPSG layers by using high selective etching;

forming a second doped polysilicon layer along a surface of said composition layer, said nitride layer, and said plug;

forming a SOG layer along a surface of said second doped polysilicon layer;

removing a portion of said SOG layer and a portion of said second doped polysilicon layer on a top surface of said composition layer by using a chemical mechanical polishing procedure to make said residual second doped polysilicon layer has two protruding portions extending upwardly thereon;

removing said composition layer, said SOG layer;

forming a capacitor dielectric layer along the surface of said second doped polysilicon layer, said nitride layer; and forming a third doped polysilicon layer over said capacitor dielectric layer.

19. The method of claim 18, wherein the step of etching the composition layer is done with a low pressure HF vapor.

20. The method of claim 18, wherein the step of removing said composition layer and said SOG layer is done using a BOE (buffer oxide etching) solution.

* * * * *